United States Patent
Yoon et al.

(10) Patent No.: US 8,027,189 B2
(45) Date of Patent: Sep. 27, 2011

(54) NONVOLATILE MEMORY DEVICE

(75) Inventors: Tae-Hun Yoon, Gyeonggi-do (KR); Hyuck-Soo Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 12/487,731

(22) Filed: Jun. 19, 2009

(65) Prior Publication Data

US 2010/0290273 A1  Nov. 18, 2010

(30) Foreign Application Priority Data

May 15, 2009  (KR) .................. 10-2009-0042602

(51) Int. Cl.
*G11C 11/00* (2006.01)
(52) U.S. Cl. ............... 365/163; 365/148; 365/189.011; 365/226
(58) Field of Classification Search .......... 365/163, 365/226, 148, 189.011
See application file for complete search history.

(56) References Cited

U.S. PATENT DOCUMENTS

| 5,455,789 A * | 10/1995 | Nakamura et al. ....... 365/185.17 |
| 7,023,738 B2 * | 4/2006 | Vimercati et al. ....... 365/185.23 |
| 7,633,806 B2 * | 12/2009 | Soerensen ............... 365/185.23 |
| 2006/0028248 A1 * | 2/2006 | Gruber et al. ............... 327/77 |

FOREIGN PATENT DOCUMENTS

| KR | 100564636 | 3/2006 |
| KR | 100764738 | 10/2007 |
| KR | 100861182 | 9/2008 |

OTHER PUBLICATIONS

Notice of Preliminary Rejection issued from Korean Intellectual Property Office on Oct. 29, 2010.

\* cited by examiner

*Primary Examiner* — Pho M Luu
(74) *Attorney, Agent, or Firm* — IP & T Group LLP

(57) ABSTRACT

A nonvolatile memory device includes a plurality of programming current driving units configured to supply memory cells with a programming current corresponding to a write data, a common programming current controlling unit configured to generate a common control voltage for controlling the programming current and a switching unit configured to transfer the common control voltage to the programming current driving unit selected among the plurality of programming current driving units by a plurality of driving selection signals.

11 Claims, 4 Drawing Sheets

NONVOLATILE MEMORY DEVICE

CROSS-REFERENCE(S) TO RELATED APPLICATIONS

The present invention claims priority of Korean Patent Application No. 10-2009-0042602, filed on May 15, 2009 which is incorporated herein by reference in its entirety.

BACKGROUND OF THE INVENTION

The present invention relates to a semiconductor design technology, and more particularly, to technology for supplying a programming current for programming a memory cell.

Phase change random access memory (PCRAM) is a representative nonvolatile memory device that programs memory cells by using a programming current.

PCRAM having a nonvolatile memory characteristic can provide a random access, and can be highly integrated at low cost. PCRAM stores data by using a phase change material. To be specific, PCRAM is a nonvolatile memory device using a phase change of a phase change material depending on a temperature condition, that is, a resistance change depending on a phase change.

A phase change material is changeable to an amorphous state or a crystalline state according to a temperature condition. A representative phase change material is a chalcogenide alloy. Since a typical example of the phase change material is $Ge_2Sb_2Te_5$ containing germanium (Ge), antimony (Sb), and tellurium (Te), the phase change material is called a "GST".

PCRAM causes a reversible phase change between a crystalline state and an amorphous state of the phase change material by using Joule heat generated by applying a specific current or voltage to the phase change material. The crystalline state is called a set state in terms of circuit. In the set state, the phase change material has an electrical characteristic like a metal with a low resistance. The amorphous state is called a reset state in terms of circuit. In the reset state, the phase change material has a resistance higher than in the set state. That is, PCRAM stores data on the basis of a resistance change between the crystalline state and the amorphous state, and determines the stored data by detecting a current flowing through the phase change material or a voltage change depending on a current change. In general, the set state is defined as having a logic level "0" and the reset state is defined as having a logic level "1". The phase change material maintains its state even when power is interrupted.

Meanwhile, a programming current can make the phase change material change from the crystalline state to the amorphous state, and vice versa. A set current is defined as a programming current that changes the phase change material of the memory cell to the set state, and a reset current is defined as a programming current that changes the phase change material of the memory cell to the reset state. The set current and the reset current are also called a set programming current and a reset programming current, respectively.

If the reset current is supplied to heat the phase change material for a certain time at a temperature higher than a melting temperature, the phase change material cools rapidly and changes to the amorphous state. Also, if the set current is supplied to heat the phase change material for a certain time at a temperature higher than a crystallization temperature and lower than a melting temperature, the phase change material cools slowly and changes to the crystalline state. Meanwhile, since a resistance value is differentiated according to the crystalline volume or the amorphous volume of the phase change material, a multi-level memory cell can be implemented. In general, the reset current is made to flow with a large current for a relatively shorter time than the set current, and the set current is made to flow with a small current for a relatively longer time than the reset current. That is, the state of the phase change material is changed by Joule heating generated under a specific condition by the supply of the programming current.

FIG. 1 is a circuit diagram of a conventional phase change memory device.

Referring to FIG. 1, the conventional nonvolatile memory device includes a plurality of programming current driving units 121, 122, 123 and 124 configured to supply a programming current IPGM corresponding to a write data to memory cells, and a plurality of programming current controlling units 111, 112, 113 and 114 configured to generate a plurality of control voltages WDB1, WDB2, WDB3 and WDB4 for controlling the programming current IPGM.

When the memory cells are phase change memory cells, the magnitude and supply time of the programming current IPGM outputted from the programming current controlling units 111, 112, 113 and 114 are determined according to the pulse waveforms of the control voltages WDB1, WDB2, WDB3 and WDB4. Therefore, the memory cells are programmed to a set state or a reset state according to the supplied programming current IPGM.

As such, the control voltages are generated from the programming current controlling units provided at the respective programming current driving units. Therefore, an entire circuit area increases due to the programming current controlling units, and a lot of current is consumed due to a large number of the programming current controlling units.

SUMMARY OF THE INVENTION

An embodiment of the present invention is directed to providing a nonvolatile memory device designed to reduce current consumption and a circuit area.

In accordance with an aspect of the present invention, there is provided a nonvolatile memory device comprising a plurality of programming current driving units configured to supply memory cells with a programming current corresponding to a write data, a common programming current controlling unit configured to generate a common control voltage for controlling the programming current, and a switching unit configured to transfer the common control voltage to the programming current driving unit selected among the plurality of programming current driving units by a plurality of driving selection signals.

In accordance with another aspect of the present invention, there is provided a nonvolatile memory device comprising a plurality of programming current driving units configured to supply memory cells with a programming current corresponding to a write data, a common programming current controlling unit configured to generate a common control voltage for controlling the programming current, a switching unit configured to transfer the common control voltage to the programming current driving unit selected among the plurality of programming current driving units by a plurality of driving selection signals, and a driving selection signal generating unit configured to generate the plurality of driving selection signals for selecting the programming current driving unit to be enabled according to a write address and a write verification result.

The nonvolatile memory device in accordance with the embodiment of the present invention can reduce an entire circuit area by controlling a plurality of programming current driving units with a common control voltage outputted from one common programming current controlling unit. Moreover, current consumption can be reduced by selectively supplying the common current voltage to the programming current driving unit to be enabled according to the write address and the write verification results.

DESCRIPTION OF SPECIFIC EMBODIMENTS

Figure 1:
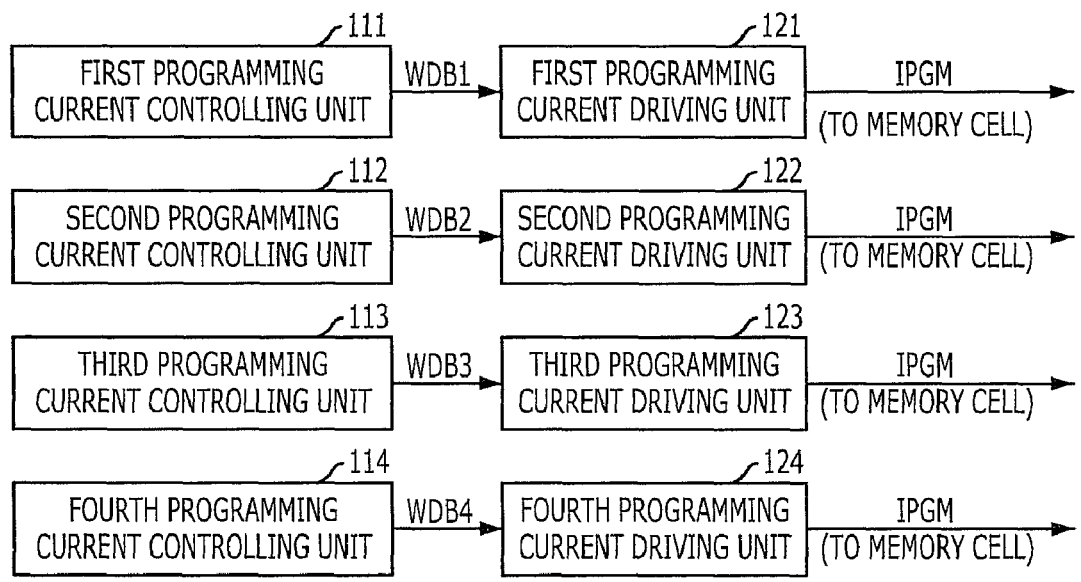
FIG. 1 is a circuit diagram of a conventional phase change memory device.

Other objects and advantages of the present invention can be understood by the following description, and become apparent with reference to the embodiments of the present invention. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit have a high level (H) and a low level (L) according to a voltage level and may be represented by "1" and "0." It will be assumed that, if necessary, the logic signals may have a high impedance (Hi-Z) state. Furthermore, the terms p-channel metal oxide semiconductor (PMOS) and n-channel metal oxide semiconductor (NMOS) used herein are a type of metal oxide semiconductor field effect transistor (MOSFET).

Figure 2:
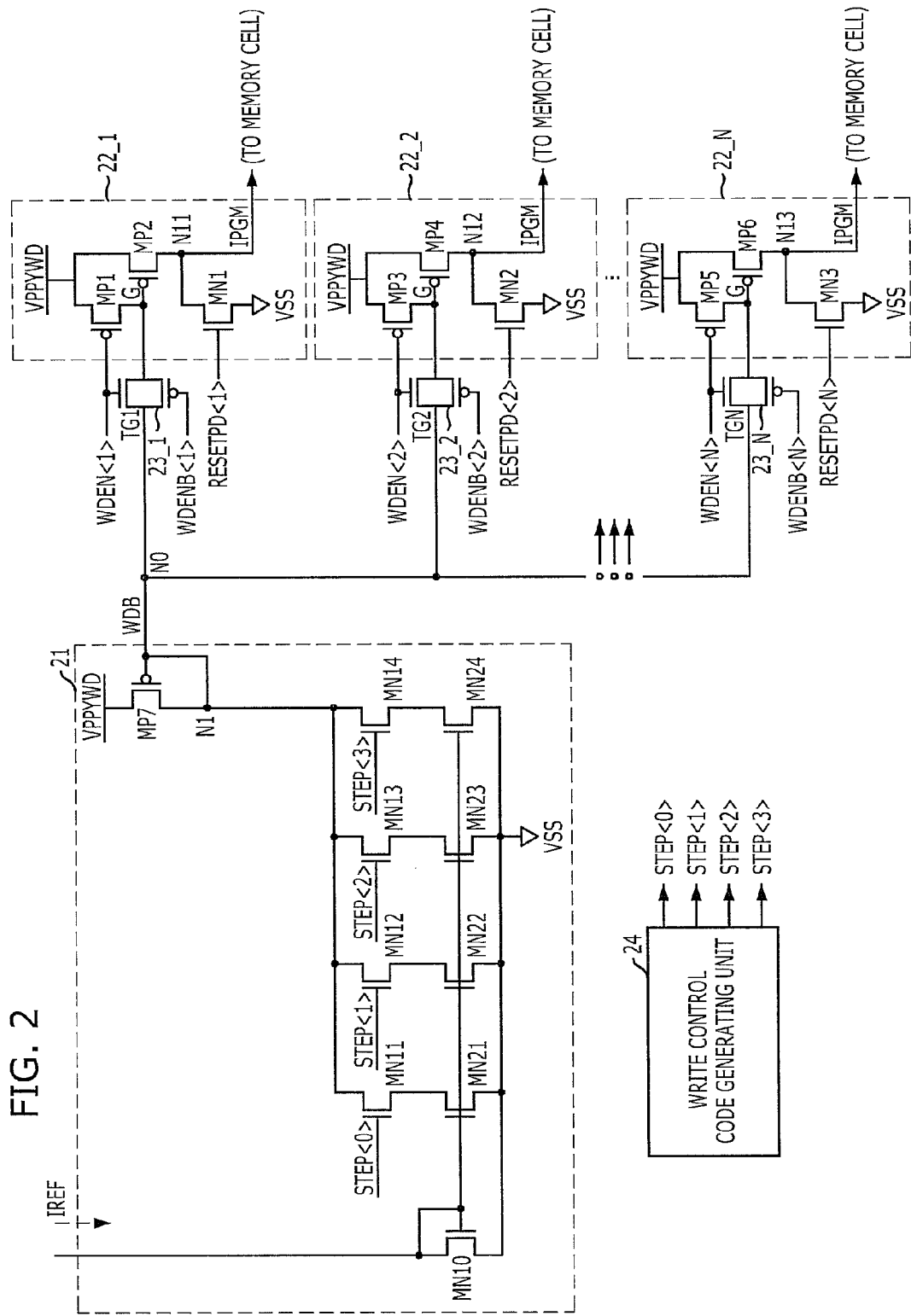
FIG. 2 is a circuit diagram of a nonvolatile memory device in accordance with an embodiment of the present invention.

FIG. 2 is a circuit diagram of a nonvolatile memory device in accordance with an embodiment of the present invention.

Referring to FIG. 2, the nonvolatile memory device includes a plurality of programming current driving units 22_1 to 22_N, a common programming current controlling unit 21, and a plurality of switching units 23_1 to 23_N. The programming current driving units 22_1 to 22_N supply memory cells with a programming current IPGM corresponding to a write data. The common programming current controlling unit 21 generates a common control voltage WDB for controlling the programming current IPGM. The switching units 23_1 to 23_N transfer the common control voltage WDB to the programming current driving unit selected among the plurality of programming current driving units 22_1 to 22_N by a plurality of driving selection signals WDEN<1>, WDENB<1>, WDEN<2>, WDENB<2>, . . . , WDEN<N> and WDENB<N>.

The nonvolatile memory device in accordance with the embodiment of the present invention may further include a write control code generating unit 24 for generating a write control code STEP<0:3> that is updated during a write enable period. The common control voltage WDB outputted from the common programming current controlling unit 21 has a voltage level corresponding to a code value of the write control code STEP<0:3>. Therefore, the common control voltage WDB having a variety of pulse waveforms according to the write control code STEP<0:3> may be generated. The memory cell described in the current embodiment is a memory cell storing a specific data value by using the programming current. Examples of the memory cell may include a phase change memory cell.

The detailed structure and operation of the nonvolatile memory device in accordance with the embodiment of the present invention will be described below.

The write control code generating unit 24 generates the write control code STEP<0:3> corresponding to a logic level or code combination of the write data. The voltage level of the common control voltage WDB is determined according to the code value of the write control code STEP<0:3>. The magnitude and waveform of the final programming current IPGM are determined according to the waveform of the common control voltage WDB. When the memory cell is the phase change memory cell, its resistance is changed according to the magnitude and supply time of the programming current IPGM, and the memory cell stores a data value corresponding to the resistance.

A current generating by mirroring a reference current IREF flows through a first node N1 of the common programming current controlling unit 21. A plurality of NMOS transistors MN11 to MN14 are connected in parallel between the first node N1 and a ground voltage terminal VSS. The number of the turned-on NMOS transistors is determined according to the code value of the write control code STEP<0:3>. The voltage level of the first node N1 is controlled by the number of the turned-on NMOS transistors. The voltage of the first node N1, that is, the voltage level of the common control voltage WDB, is determined by the code value of the write control code STEP<0:3>.

The switching units 23_1 to 23_N are implemented with a plurality of transmission gates TG1 to TGN that receive the common control voltage WDB and selectively transfer the common control voltage WDB according to the control of the driving selection signals WDEN<1>, WDENB<1>, WDEN<2>, WDENB<2>, . . . , WDEN<N> and WDENB<N>. Since the transmission gate controlled by the activated driving selection signal among the plurality of transmission gates TG1 to TGN is turned on, the common control voltage WDB is transferred to the programming current driving unit connected to the turned-on transmission gate.

The programming current driving units 22_1 to 22_N output the programming current IPGM to output terminals N11, N12 and N13 according to the control of the common control voltage WDB. The programming current IPGM is finally transferred to the memory cell, whereby the memory cell is programmed. Since the programming current driving units 22_1 to 22_N have the same circuit configuration, the first programming current driving units 22_1 will be described as a representative example.

The first programming current driving unit 22_1 includes a first PMOS transistor MP2, a second PMOS transistor MP1, and an NMOS transistor MN1. The first PMOS transistor MP2 is connected between a power supply voltage terminal VPPYWD and the output terminal N11 and is controlled by a signal received through its gate. The second PMOS transistor MP1 supplies a precharge voltage VPPYWD to a gate G of the first PMOS transistor MP2 under the control of the first driving selection signals WDEN<1> and WDENB<1>. The NMOS transistor MN1 is connected between a ground voltage terminal VSS and the output terminal N11 and is controlled by a reset signal RESETPD.

When the first driving selection signals WDEN<1> and WDENB<1> are deactivated, the first transmission gate TG1 is turned off and the second PMOS transistor MP1 is turned on. Thus, the power supply voltage VPPYWD is transferred to the gate G of the first PMOS transistor MP2, that is, the driving transistor, so that the programming current IPGM is not outputted at the output terminal N11.

When the first driving selection signal WDEN<1> and WDENB<1> are activated, the first transmission gate TG1 is turned on and the second PMOS transistor MP1 is turned off. Thus, the common control voltage WDB having a pulse waveform is transferred to the gate G of the first PMOS transistor MP2, that is, the driving transistor, so that the programming current IPGM corresponding to the voltage level of the common control voltage WDB is outputted at the output terminal N11.

In the current embodiment, the number of the programming current driving units 22_1 to 22_N to be driven by the common control voltage WDB of the common programming current controlling unit 21 is determined by the number of the turned-on transmission gates TG1 to TGN. Since the transmission gates TG1 to TGN are selectively turned on by the driving selection signals WDEN<1>, WDENB<1>, WDEN<2>, WDENB<2>, . . . , WDEN<N> and WDENB<N>, the magnitude of the current consumed for driving the common control voltage WDB decreases. Since the load capacitance, that is, the size of the load to be driven by the common programming current controlling unit 21, is controlled by the transmission gates, the current necessary to drive the common control voltage WDB can be reduced.

Figure 3:
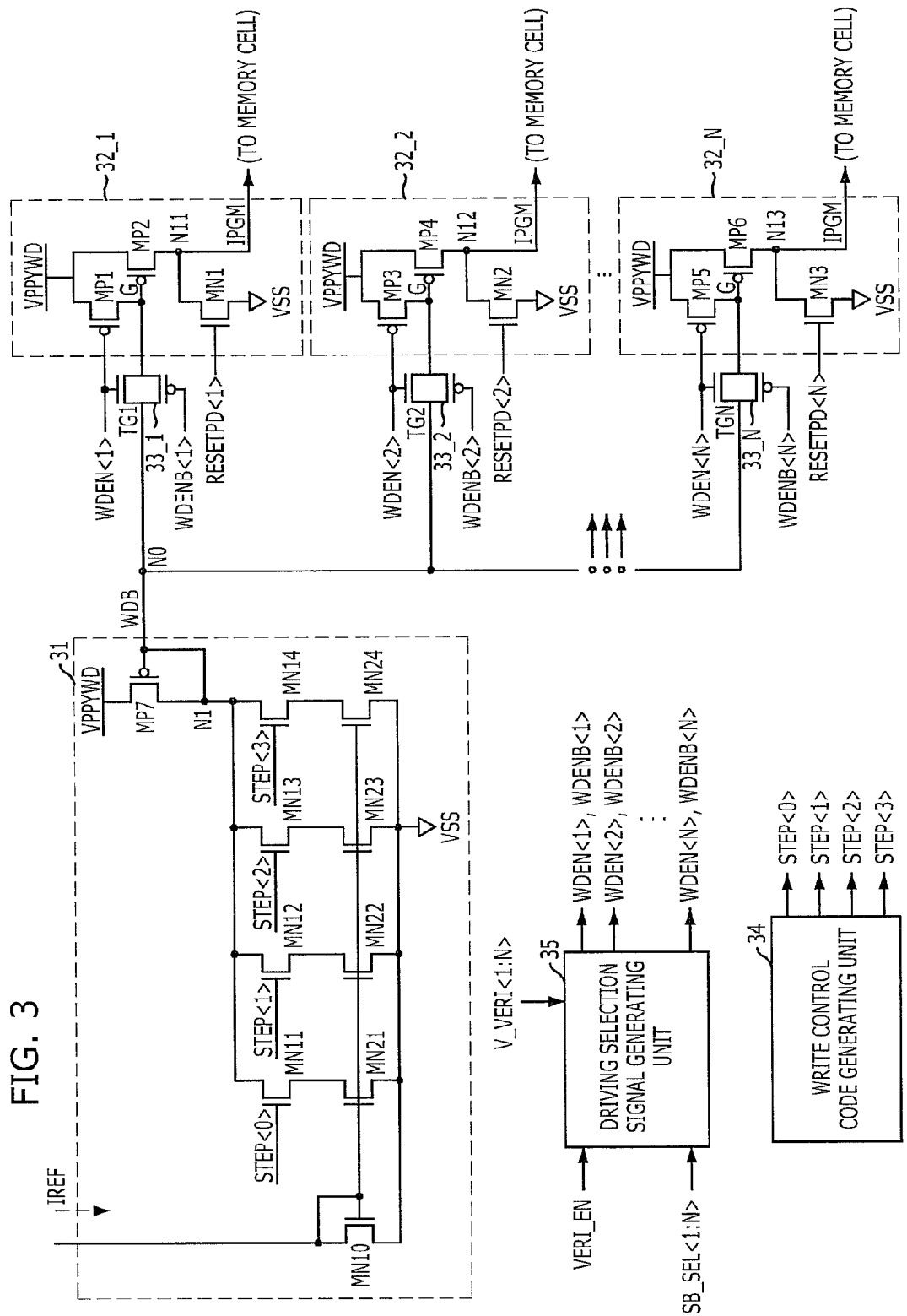
FIG. 3 is a circuit diagram of a nonvolatile memory device in accordance with another embodiment of the present invention.

FIG. 3 is a circuit diagram of a nonvolatile memory device in accordance with another embodiment of the present invention.

Referring to FIG. 3, the nonvolatile memory device includes a plurality of programming current driving units 32_1 to 32_N, a common programming current controlling unit 31, a plurality of switching units 33_1 to 33_N, and a driving selection signal generating unit 35. The programming current driving units 32_1 to 32_N supply memory cells with a programming current IPGM corresponding to a write data. The common programming current controlling unit 31 generates a common control voltage WDB for controlling the programming current IPGM. The switching units 33_1 to 33_N transfer the common control voltage WDB to the programming current driving unit selected among the plurality of programming current driving units 32_1 to 32_N by a plurality of driving selection signals WDEN<1>, WDENB<1>, WDEN<2>, WDENB<2>, . . . , WDEN<N> and WDENB<N>. The driving selection signal generating unit 35 generates the plurality of driving selection signals WDEN<1>, WDENB<1>, WDEN<2>, WDENB<2>, . . . , WDEN<N> and WDENB<N> for selecting the programming current driving unit to be enabled according to a write address and a write verification result.

The nonvolatile memory device in accordance with the embodiment of the present invention may further include a write control code generating unit 34 for generating a write control code STEP<0:3> that is updated during a write enable period. The common control voltage WDB outputted from the common programming current controlling unit 31 has a voltage level corresponding to a code value of the write control code STEP<0:3>. Therefore, the common control voltage WDB having a variety of pulse waveforms according to the write control code STEP<0:3> may be generated. The memory cell described in the current embodiment is a memory cell storing a specific data value by using the programming current. Examples of the memory cell may include a phase change memory cell.

The detailed structure and operation of the nonvolatile memory device in accordance with the embodiment of the present invention will be described below.

The write control code generating unit 34 generates the write control code STEP<0:3> corresponding to a logic level or code combination of the write data. The voltage level of the common control voltage WDB is determined according to the code value of the write control code STEP<0:3>. The magnitude and waveform of the final programming current IPGM are determined according to the waveform of the common control voltage WDB. When the memory cell is the phase change memory cell, its resistance is changed according to the magnitude and supply time of the programming current IPGM, and the memory cell stores a data value corresponding to the resistance.

A current generating by mirroring a reference current IREF flows through a first node N1 of the common programming current controlling unit 31. A plurality of NMOS transistors MN11 to MN14 are connected in parallel between the first node N1 and a ground voltage terminal VSS. The number of the turned-on NMOS transistors is determined according to the code value of the write control code STEP<0:3>. The voltage level of the first node N1 is controlled by the number of the turned-on NMOS transistors. The voltage of the first node N1, that is, the voltage level of the common control voltage WDB, is determined by the code value of the write control code STEP<0:3>.

The switching units 33_1 to 33_N are implemented with a plurality of transmission gates TG1 to TGN that receive the common control voltage WDB and selectively transfer the common control voltage WDB according to the control of the driving selection signals WDEN<1>, WDENB<1>, WDEN<2>, WDENB<2>, . . . , WDEN<N> and WDENB<N>. Since the transmission gate controlled by the activated driving selection signal among the plurality of transmission gates TG1 to TGN is turned on, the common control voltage WDB is transferred to the programming current driving unit connected to the turned-on transmission gate.

The programming current driving units 32_1 to 32_N output the programming current IPGM to output terminals N11, N12 and N13 according to the control of the common control voltage WDB. The programming current IPGM is finally transferred to the memory cell, whereby the memory cell is programmed. Since the programming current driving units 32_1 to 32_N have the same circuit configuration, the first programming current driving units 32_1 will be described as a representative example.

The first programming current driving unit 32_1 includes a first PMOS transistor MP2, a second PMOS transistor MP1, and an NMOS transistor MN1. The first PMOS transistor MP2 is connected between a power supply voltage terminal VPPYWD and the output terminal N11 and is controlled by a signal received through its gate. The second PMOS transistor MP1 supplies a precharge voltage VPPYWD to a gate G of the first PMOS transistor MP2 under the control of the first driving selection signals WDEN<1> and WDENB<1>. The NMOS transistor MN1 is connected between a ground voltage terminal VSS and the output terminal N11 and is controlled by a reset signal RESETPD.

When the first driving selection signals WDEN<1> and WDENB<1> are deactivated, the first transmission gate TG1 is turned off and the second PMOS transistor MP1 is turned on. Thus, the power supply voltage VPPYWD is transferred to the gate G of the first PMOS transistor MP2, that is, the driving transistor, so that the programming current IPGM is not outputted at the output terminal N11.

When the first driving selection signal WDEN<1> and WDENB<1> are activated, the first transmission gate TG1 is turned on and the second PMOS transistor MP1 is turned off.

Thus, the common control voltage WDB having a pulse waveform is transferred to the gate G of the first PMOS transistor MP2, that is, the driving transistor, so that the programming current IPGM corresponding to the voltage level of the common control voltage WDB is outputted at the output terminal N11.

In the current embodiment, the number of the programming current driving units 32_1 to 32_N to be driven by the common control voltage WDB of the common programming current controlling unit 21 is determined by the number of the turned-on transmission gates TG1 to TGN. Since the transmission gates TG1 to TGN are selectively turned on by the driving selection signals WDEN<1>, WDENB<1>, WDEN<2>, WDENB<2>, ..., WDEN<N> and WDENB<N>, the magnitude of the current consumed for driving the common control voltage WDB decreases. Since the load capacitance, that is, the size of the load to be driven by the common programming current controlling unit 31, is controlled by the transmission gates, the current necessary to drive the common control voltage WDB can be reduced.

Meanwhile, the activation of the driving selection signals WDEN<1>, WDENB<1>, WDEN<2>, WDENB<2>, ..., WDEN<N> and WDENB<N> is determined by the driving selection signal generating unit 35. That is, the driving selection signal generating unit 35 generates the driving selection signals WDEN<1>, WDENB<1>, WDEN<2>, WDENB<2>, ..., WDEN<N> and WDENB<N> for selecting the programming current driving unit to be enabled according to the write address and the write verification result.

After the operation of programming the memory cell selected by the write address, a write verification operation is performed to confirm whether the memory cell is correctly programmed. The voltage level of a programming verification voltage V_VERI<1:N> is changed according to the programming degree of the memory cell. Therefore, the programming current is again supplied to the memory cell when the voltage level of the programming verification voltage V_VERI<1:N> does not fall within a predefined range.

Figure 4:
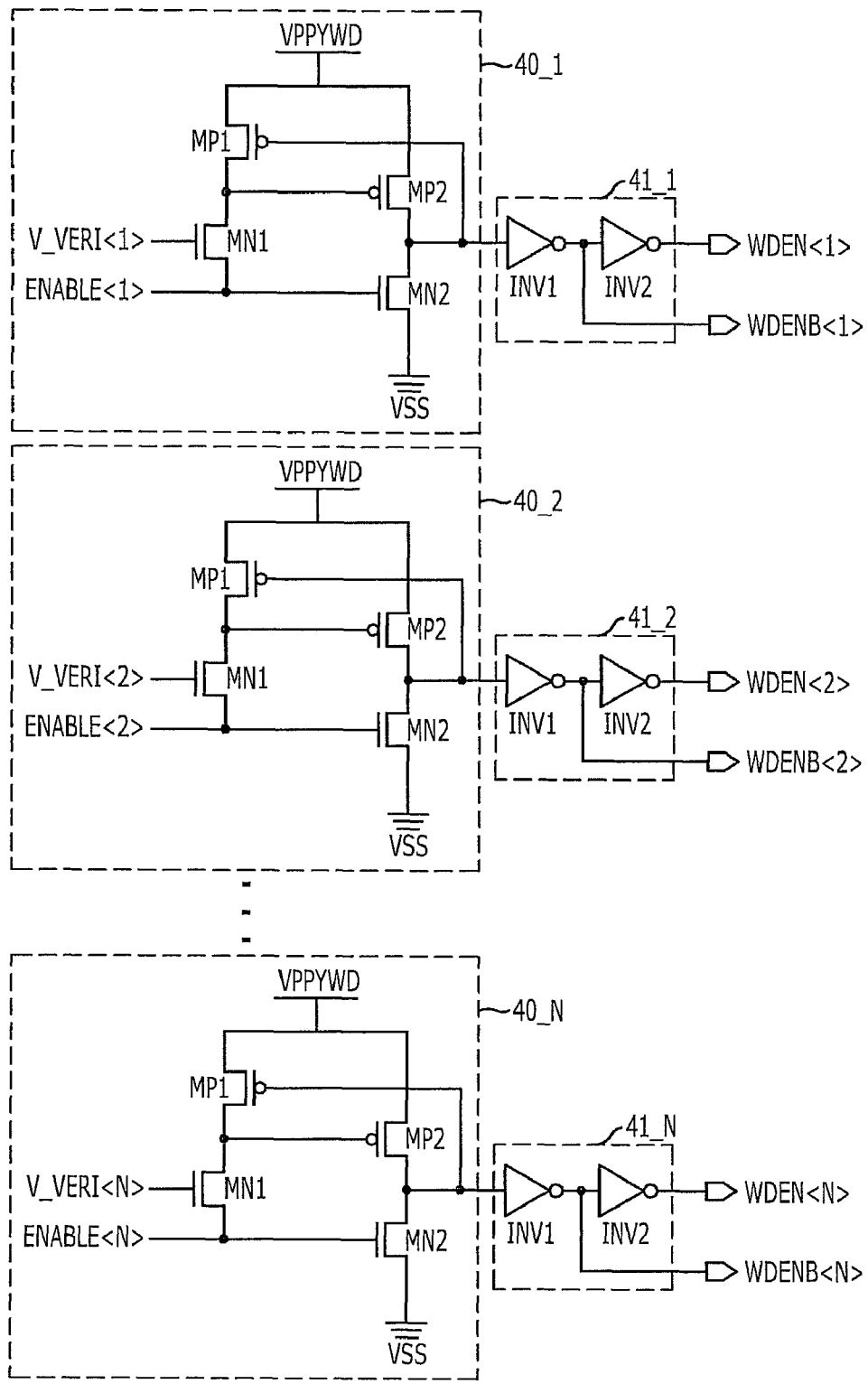
FIG. 4 is a circuit diagram of a driving selection signal generating unit in accordance with an embodiment of the present invention.

FIG. 4 is a circuit diagram of the driving selection signal generating unit in accordance with an embodiment of the present invention.

Referring to FIG. 4, the driving selection signal generating unit includes a plurality of voltage detecting units 40_1 to 40_N, and a plurality of signal output units 41_1 to 41_N. The voltage detecting units 40_1 to 40_N detect the voltage level of the programming verification voltage V_VERI<1:N> of each memory cell. The signal output units 41_1 to 41_N output the driving selection signals WDEN<1>, WDENB<1>, WDEN<2>, WDENB<2>, ..., WDEN<N> and WDENB<N> corresponding to the detection results of the voltage detecting units 40_1 to 40_N.

The internal operation of the first voltage detecting unit 40_1 and the first signal output unit 41_1 will be described as a representative example.

The first voltage detecting unit 40_1 outputs a detection signal having a logic level corresponding to a voltage level of the first programming verification voltage V_VERI<1> in response to an enable signal ENABLE<1>, and the first signal output unit 41_1 outputs the first driving selection signals WDEN<1> and WDENB<1> that are activated in response to the detection signal. That is, the first driving selection signals WDEN<1> and WDENB<1> are activated when the voltage level of the first programming verification voltage V-VERI<1:N> does not reach a predefined range.

Therefore, the driving selection signals WDEN<1>, WDENB<1>, WDEN<2>, WDENB<2>, ..., WDEN<N> and WDENB<N> are selectively activated according to the voltage levels of the corresponding programming verification voltages V_VERI<1:N>.

In accordance with the embodiments of the present invention, the circuit area, that is, the layout area, can be reduced by controlling the plurality of programming current driving units by using the common control voltage of the common programming current controlling unit. Moreover, the size of the load to be driven by the common control voltage is reduced by selectively supplying the common control voltage only to the programming current driving unit to be enabled according to the address and the write verification result, thereby reducing the current consumption.

While the present invention has been described with respect to the specific embodiments, it will be apparent to those skilled in the art that various changes and modifications may be made without departing from the spirit and scope of the invention as defined in the following claims.

For example, although not directly related to the technical spirit of the present invention, embodiments including additional structures may be exemplified for further detailed description. Furthermore, the active high or active low structure representing the activation states of signals or circuits may be changed according to embodiments. Moreover, the configurations of the transistors may also be changed in order to implement the same functions. That is, the PMOS transistor and the NMOS transistor may be exchanged with each other and, if necessary, a variety of transistors may be used herein. Moreover, modifications can be made in the logic gate configurations in order to implement the same functions. That is, NAND units and NOR units may be implemented with various combinations of NAND gates, NOR gates, and inverters. Numerous modifications can be made in the circuit configuration and can be easily deduced by those skilled in the art. Therefore, their enumeration will be omitted herein.

What is claimed is:

1. A nonvolatile memory device, comprising:
    a plurality of programming current driving units configured to supply memory cells with a programming current corresponding to a write data;
    a common programming current controlling unit configured to generate a common control voltage for controlling the programming current; and
    a switching unit configured to transfer the common control voltage to the programming current driving unit selected among the plurality of programming current driving units by a plurality of driving selection signals.

2. The nonvolatile memory device of claim 1, further comprising a write control code generating unit configured to generate a write control code that is updated during a write enable period, wherein the common control voltage outputted from the common programming current controlling unit has a voltage level corresponding to a code value of the write control code.

3. The nonvolatile memory device of claim 1, wherein the memory cell comprises a phase change memory cell.

4. The nonvolatile memory device of claim 1, wherein the programming current driving units each comprises:
    a driving transistor connected between a power supply voltage terminal and an output terminal and controlled by a signal inputted through a gate thereof;
    a first transistor configured to supply a precharge voltage to the gate of the driving transistor under control of the corresponding driving selection signal; and
    a second transistor connected between a ground voltage terminal and the output terminal and controlled by a reset signal.

5. The nonvolatile memory device of claim 1, wherein the switching unit comprises a plurality of transmission gates configured to receive the common control voltage and selectively transfer the common control voltage according to control of the driving selection signals.

6. A nonvolatile memory device, comprising:
a plurality of programming current driving units configured to supply memory cells with a programming current corresponding to a write data;
a common programming current controlling unit configured to generate a common control voltage for controlling the programming current;
a switching unit configured to transfer the common control voltage to the programming current driving unit selected among the plurality of programming current driving units by a plurality of driving selection signals; and
a driving selection signal generating unit configured to generate the plurality of driving selection signals for selecting the programming current driving unit to be enabled according to a write address and a write verification result.

7. The nonvolatile memory device of claim 6, further comprising a write control code generating unit configured to generate a write control code that is updated during a write enable period, wherein the common control voltage outputted from the common programming current controlling unit has a voltage level corresponding to a code value of the write control code.

8. The nonvolatile memory device of claim 6, wherein the memory cell comprises a phase change memory cell.

9. The nonvolatile memory device of claim 6, wherein the programming current driving units each comprises:
a driving transistor connected between a power supply voltage terminal and an output terminal and controlled by a signal inputted through a gate thereof;
a first transistor configured to supply a precharge voltage to the gate of the driving transistor under control of the corresponding driving selection signal; and
a second transistor connected between a ground voltage terminal and the output terminal and controlled by a reset signal.

10. The nonvolatile memory device of claim 6, wherein the switching unit comprises a plurality of transmission gates configured to receive the common control voltage and selectively transfer the common control voltage according to control of the driving selection signals.

11. The nonvolatile memory device of claim 6, wherein the driving selection signal generating unit comprises:
a plurality of voltage detecting units configured to detect a voltage level of a programming verification voltage of each of the memory cells; and
a plurality of signal output units configured to output the plurality of driving selection signals according to detection results of the voltage detecting units.

* * * * *